(12) United States Patent
Hung et al.

(10) Patent No.: US 11,037,861 B2
(45) Date of Patent: *Jun. 15, 2021

(54) INTERCONNECT STRUCTURE FOR PACKAGE-ON-PACKAGE DEVICES

(71) Applicant: Taiwan Semiconductor Manufacturing Company, Ltd., Hsinchu (TW)

(72) Inventors: Jui-Pin Hung, Hsinchu (TW); Jing-Cheng Lin, Hsinchu (TW); Po-Hao Tsai, Zhongli (TW); Yi-Jou Lin, Hsinchu (TW); Shuo-Mao Chen, New Taipei (TW); Chiung-Han Yeh, Tainan (TW); Der-Chyang Yeh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/683,672

(22) Filed: Nov. 14, 2019

(65) Prior Publication Data
US 2020/0083145 A1    Mar. 12, 2020

Related U.S. Application Data

(63) Continuation of application No. 16/390,138, filed on Apr. 22, 2019, now Pat. No. 10,515,875, which is a
(Continued)

(51) Int. Cl.
*H01L 23/12*    (2006.01)
*H01L 21/00*    (2006.01)
(Continued)

(52) U.S. Cl.
CPC .......... *H01L 23/481* (2013.01); *H01L 21/486* (2013.01); *H01L 21/4853* (2013.01);
(Continued)

(58) Field of Classification Search
CPC . H01L 23/481; H01L 21/4853; H01L 21/486; H01L 21/561; H01L 21/563;
(Continued)

(56) References Cited

U.S. PATENT DOCUMENTS 5,634,268 A    6/1997 Dalal et al.
5,804,882 A    9/1998 Tsukagoshi et al.
(Continued)

FOREIGN PATENT DOCUMENTS

CN    1185859 A    6/1998
CN    1359151 A    7/2002
(Continued)

*Primary Examiner* — Alonzo Chambliss
(74) *Attorney, Agent, or Firm* — Slater Matsil, LLP

(57) ABSTRACT

An interconnect structure and a method of forming an interconnect structure are provided. The interconnect structure is formed over a carrier substrate, upon which a die may also be attached. Upon removal of the carrier substrate and singulation, a first package is formed. A second package may be attached to the first package, wherein the second package may be electrically coupled to through vias formed in the first package.

20 Claims, 17 Drawing Sheets

Related U.S. Application Data continuation of application No. 15/924,997, filed on Mar. 19, 2018, now Pat. No. 10,269,685, which is a continuation of application No. 15/283,118, filed on Sep. 30, 2016, now Pat. No. 9,922,903, which is a continuation of application No. 14/720,154, filed on May 22, 2015, now Pat. No. 9,460,987, which is a continuation of application No. 13/787,547, filed on Mar. 6, 2013, now Pat. No. 9,048,222.

(51) Int. Cl.

| *H01L 23/48* | (2006.01) |
|---|---|
| *H01L 23/00* | (2006.01) |
| *H01L 23/528* | (2006.01) |
| *H01L 25/065* | (2006.01) |
| *H01L 23/538* | (2006.01) |
| *H01L 23/28* | (2006.01) |
| *H01L 23/498* | (2006.01) |
| *H01L 21/56* | (2006.01) |
| *H01L 25/10* | (2006.01) |
| *H01L 21/768* | (2006.01) |
| *H01L 21/82* | (2006.01) |
| *H01L 25/18* | (2006.01) |
| *H01L 25/00* | (2006.01) |
| *H01L 21/48* | (2006.01) |
| *H01L 23/31* | (2006.01) |

(52) U.S. Cl.
CPC .......... *H01L 21/561* (2013.01); *H01L 21/563* (2013.01); *H01L 21/565* (2013.01); *H01L 21/76843* (2013.01); *H01L 21/82* (2013.01); *H01L 23/28* (2013.01); *H01L 23/3128* (2013.01); *H01L 23/49838* (2013.01); *H01L 23/528* (2013.01); *H01L 23/5384* (2013.01); *H01L 23/5386* (2013.01); *H01L 23/5389* (2013.01); *H01L 24/11* (2013.01); *H01L 24/19* (2013.01); *H01L 24/81* (2013.01); *H01L 24/97* (2013.01); *H01L 25/0657* (2013.01); *H01L 25/105* (2013.01); *H01L 25/18* (2013.01); *H01L 25/50* (2013.01); *H01L 21/56* (2013.01); *H01L 21/568* (2013.01); *H01L 23/49816* (2013.01); *H01L 24/73* (2013.01); *H01L 2224/0401* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83* (2013.01); *H01L 2224/92244* (2013.01); *H01L 2224/97* (2013.01); *H01L 2225/0651* (2013.01); *H01L 2225/0652* (2013.01); *H01L 2225/06541* (2013.01); *H01L 2225/06548* (2013.01); *H01L 2225/06568* (2013.01); *H01L 2225/1035* (2013.01); *H01L 2225/1058* (2013.01); *H01L 2924/12042* (2013.01); *H01L 2924/181* (2013.01); *H01L 2924/18162* (2013.01)

(58) Field of Classification Search
CPC . H01L 21/565; H01L 21/76843; H01L 21/82; H01L 23/28; H01L 23/3128; H01L 23/49838; H01L 23/528; H01L 23/5384; H01L 23/5386; H01L 23/5389; H01L 24/11; H01L 24/19; H01L 24/81; H01L 24/97; H01L 25/0657; H01L 25/105; H01L 25/18; H01L 25/50; H01L 23/49816

See application file for complete search history.

(56) References Cited

U.S. PATENT DOCUMENTS

| 6,333,561 | B1 | 12/2001 | Chen |
|---|---|---|---|
| 6,555,906 | B2 | 4/2003 | Towle et al. |
| 7,619,901 | B2 | 11/2009 | Eichelberger et al. |
| 7,863,088 | B2 | 1/2011 | Brunnbauer et al. |
| 8,039,303 | B2 | 10/2011 | Shim et al. |
| 8,072,059 | B2 | 12/2011 | Shim et al. |
| 8,097,490 | B1 | 1/2012 | Pagaila et al. |
| 8,133,762 | B2 | 3/2012 | Pagaila et al. |
| 8,193,604 | B2 | 6/2012 | Lin et al. |
| 8,283,205 | B2 | 10/2012 | Pagaila et al. |
| 8,291,584 | B2 | 10/2012 | Tanaka |
| 8,319,338 | B1 | 11/2012 | Berry et al. |
| 8,330,273 | B2 | 12/2012 | Brunnbauer et al. |
| 8,354,304 | B2 | 1/2013 | Chow et al. |
| 8,361,842 | B2 | 1/2013 | Yu et al. |
| 8,474,133 | B2 | 7/2013 | Eichelberger et al. |
| 8,476,824 | B2 | 7/2013 | Yu et al. |
| 8,609,465 | B2 | 12/2013 | Kawahara |
| 8,680,647 | B2 | 3/2014 | Yu et al. |
| 8,703,542 | B2 | 4/2014 | Lin et al. |
| 8,741,690 | B2 | 6/2014 | Meyer et al. |
| 8,742,579 | B2 | 6/2014 | Pagaila et al. |
| 8,759,147 | B2 | 6/2014 | Choi et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,796,846 | B2 | 8/2014 | Lin et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 8,889,484 | B2 | 11/2014 | Chen et al. |
| 8,916,969 | B2 | 12/2014 | Chen et al. |
| 8,928,128 | B2 | 1/2015 | Karikalan |
| 8,952,521 | B2 | 2/2015 | Wojnowski et al. |
| 8,975,741 | B2* | 3/2015 | Lin .................. H01L 24/92 257/700 |
| 9,000,583 | B2 | 4/2015 | Haba et al. |
| 9,048,222 | B2* | 6/2015 | Hung ................ H01L 23/528 |
| 9,378,982 | B2 | 6/2016 | Lin et al. |
| 9,460,987 | B2* | 10/2016 | Hung ............. H01L 21/76843 |
| 9,659,805 | B2* | 5/2017 | Hu ................... H01L 23/5389 |
| 9,685,411 | B2* | 6/2017 | Chen ................ H01L 23/544 |
| 9,799,631 | B2 | 10/2017 | Lin et al. |
| 9,922,903 | B2* | 3/2018 | Hung ............... H01L 25/0657 |
| 10,269,685 | B2* | 4/2019 | Hung ................ H01L 21/486 |
| 10,276,536 | B2* | 4/2019 | Pei .................. H01L 23/562 |
| 10,515,875 | B2* | 12/2019 | Hung ................. H01L 24/11 |
| 2005/0277550 | A1 | 12/2005 | Brown et al. |
| 2006/0038291 | A1 | 2/2006 | Chung et al. |
| 2006/0194331 | A1 | 8/2006 | Pamula et al. |
| 2007/0227765 | A1 | 10/2007 | Sakamoto et al. |
| 2007/0287230 | A1 | 12/2007 | Kuramochi et al. |
| 2008/0029886 | A1 | 2/2008 | Cotte et al. |
| 2008/0044944 | A1 | 2/2008 | Wakisaka et al. |
| 2008/0157330 | A1 | 7/2008 | Kroehnert et al. |
| 2008/0284035 | A1 | 11/2008 | Brunnbauer et al. |
| 2009/0008765 | A1 | 1/2009 | Yamano et al. |
| 2009/0053858 | A1 | 2/2009 | Ko et al. |
| 2009/0236752 | A1 | 9/2009 | Lee et al. |
| 2009/0293271 | A1 | 12/2009 | Tanaka |
| 2010/0133704 | A1 | 6/2010 | Marimuthu et al. |
| 2011/0193216 | A1 | 8/2011 | Lin et al. |
| 2011/0291288 | A1 | 12/2011 | Wu et al. |
| 2012/0062439 | A1 | 3/2012 | Liao et al. |
| 2012/0112355 | A1 | 5/2012 | Pagaila et al. |
| 2012/0119378 | A1 | 5/2012 | Ng et al. |
| 2012/0171814 | A1 | 7/2012 | Choi et al. |
| 2012/0199981 | A1 | 8/2012 | Jeong et al. |
| 2012/0208319 | A1 | 8/2012 | Meyer et al. |

(56) References Cited

U.S. PATENT DOCUMENTS

| | | |
|---|---|---|
| 2012/0231584 A1 | 9/2012 | Kawahara |
| 2012/0319284 A1 | 12/2012 | Ko et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0105991 A1 | 5/2013 | Gan et al. |
| 2013/0168848 A1 | 7/2013 | Lin et al. |
| 2013/0187268 A1 | 7/2013 | Lin et al. |
| 2013/0249101 A1 | 9/2013 | Lin et al. |
| 2013/0270685 A1 | 10/2013 | Yim et al. |
| 2013/0297981 A1 | 11/2013 | Gu et al. |
| 2013/0307140 A1 | 11/2013 | Huang et al. |
| 2013/0328212 A1 | 12/2013 | Chino |
| 2014/0061937 A1 | 3/2014 | Hu et al. |
| 2014/0077394 A1 | 3/2014 | Chang et al. |
| 2014/0091471 A1 | 4/2014 | Chen et al. |
| 2014/0110840 A1 | 4/2014 | Wojnowski et al. |
| 2014/0203429 A1 | 7/2014 | Yu et al. |
| 2014/0203443 A1 | 7/2014 | Pagaila et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0255431 A1 | 9/2015 | Su et al. |
| 2015/0255432 A1 | 9/2015 | Lin et al. |
| 2015/0255447 A1 | 9/2015 | Hung et al. |
| 2016/0148857 A1 | 5/2016 | Lin et al. |
| 2017/0229432 A1 | 8/2017 | Lin et al. |

FOREIGN PATENT DOCUMENTS

| | | |
|---|---|---|
| CN | 1738017 A | 2/2006 |
| CN | 101308803 A | 11/2008 |
| CN | 102576682 A | 7/2012 |
| CN | 102903691 A | 1/2013 |
| CN | 103219307 A | 7/2013 |
| CN | 103325727 A | 9/2013 |
| CN | 103972191 A | 8/2014 |
| DE | 10110453 A1 | 5/2002 |
| DE | 102005040213 A1 | 3/2006 |
| DE | 102005043557 A1 | 9/2006 |
| DE | 102011001405 A1 | 10/2011 |
| JP | 2012199494 A | 10/2012 |
| KR | 20120077875 A | 7/2012 |
| KR | 20120101885 A | 9/2012 |
| KR | 20130035805 A | 4/2013 |
| KR | 1020130035805 A | 4/2013 |
| KR | 20130052179 A | 5/2013 |
| KR | 20130116100 A | 10/2013 |
| KR | 20140043651 A | 4/2014 |
| TW | 201413882 A | 4/2014 |
| TW | 201431039 A | 8/2014 |
| TW | 201436067 A | 9/2014 |

\* cited by examiner

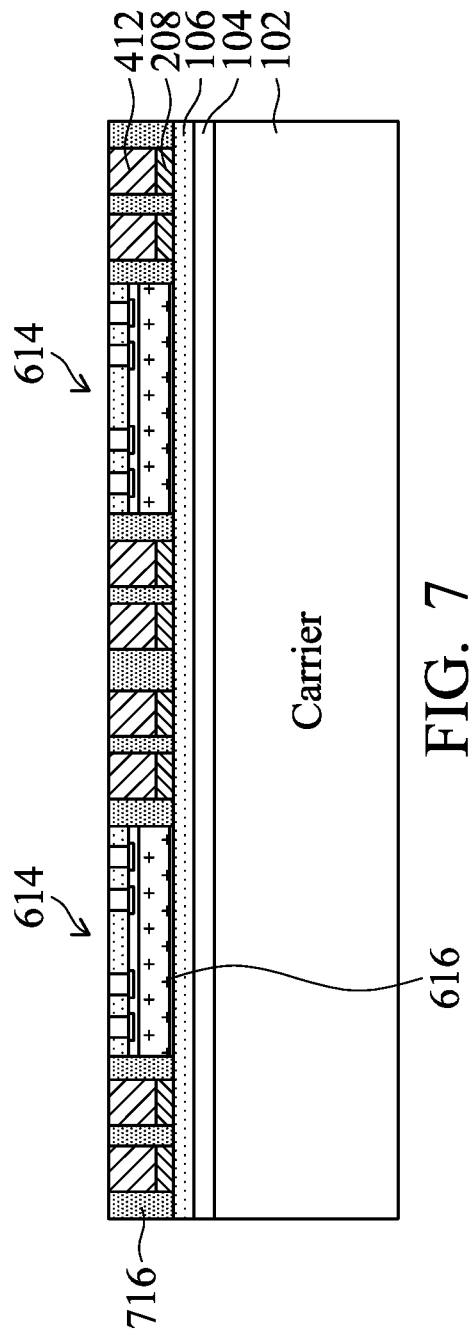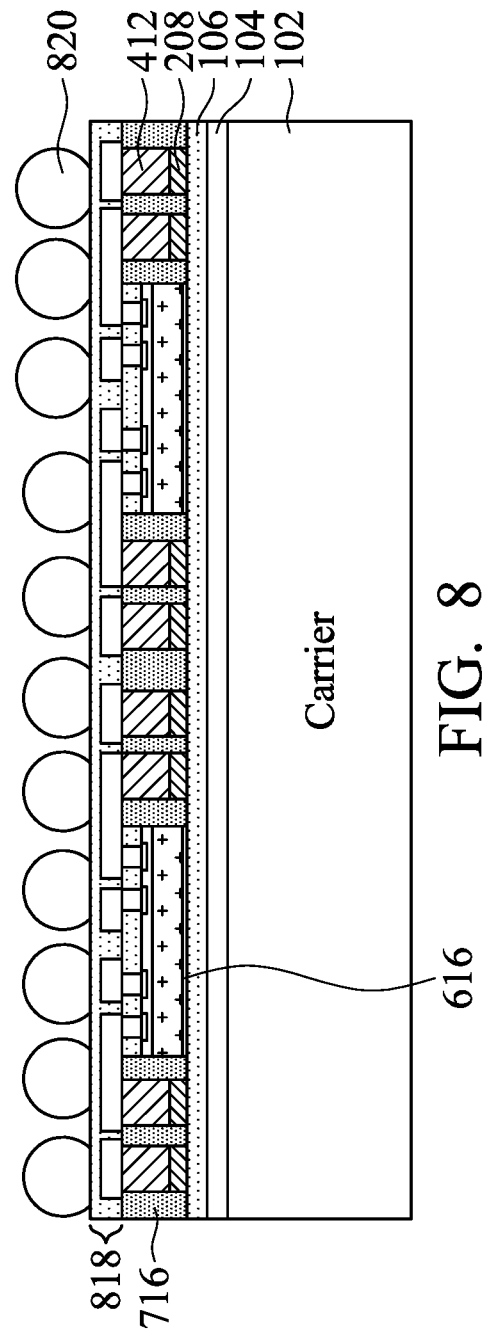

INTERCONNECT STRUCTURE FOR PACKAGE-ON-PACKAGE DEVICES

This application is a continuation of U.S. patent application Ser. No. 16/390,138, filed on Apr. 22, 2019, entitled "Interconnect Structure for Package-On-Package Devices," now U.S. Pat. No. 10,515,875, which is a continuation of U.S. patent application Ser. No. 15/924,997, filed on Mar. 19, 2018, entitled "Interconnect Structure for Package-On-Package Devices," now U.S. Pat. No. 10,269,685, which is a continuation of U.S. patent application Ser. No. 15/283,118, filed on Sep. 30, 2016, entitled "Interconnect Structure for Package-On-Package Devices and a Method of Fabricating," now U.S. Pat. No. 9,922,903, which is a continuation of U.S. patent application Ser. No. 14/720,154, filed on May 22, 2015, entitled "Interconnect Structure For Package-On-Package Devices And A Method of Fabricating," now U.S. Pat. No. 9,460,987, which is a continuation of U.S. patent application Ser. No. 13/787,547, filed on Mar. 6, 2013, entitled "Method of Fabricating Interconnect Structure for Package-on-Package Devices," now U.S. Pat. No. 9,048,222, which applications are hereby incorporated herein by reference in their entirety.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DICs) were thus formed, wherein two dies or packages may be stacked, with through-silicon vias (TSVs) formed in one of the dies or packages to connect the other die to another substrate. Package on Package (PoP) is becoming an increasingly popular integrated circuit packaging technique because it allows for higher density electronics.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1-11 illustrate various intermediate stages in the manufacturing of a package in accordance with an embodiment;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel three-dimensional integrated circuit (3DIC) and the method of forming the same are provided. The intermediate stages of manufacturing an embodiment are illustrated. The variations of the embodiment are discussed. Throughout the various views and illustrative embodiments, like reference numbers are used to designate like elements.

FIGS. 1-11 illustrate various intermediate stages of manufacturing in which a package-on-package (PoP) structure is fabricated. In this embodiment a protective layer (e.g., a PBO layer) is formed over an integrated circuit die in a lower package, wherein the protective layer extends over an upper surface of the lower package. Openings are formed in the protective layer to allow electrical connections to be formed.

Figure 1:
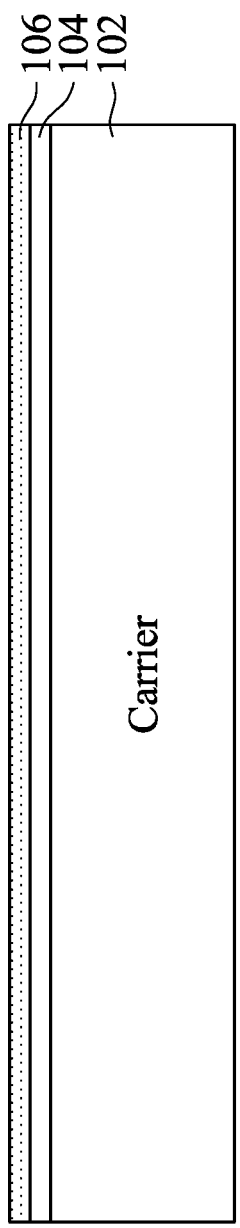

Referring first to FIG. 1, there is shown a carrier substrate 102 having an adhesive layer 104 and a protective layer 106 formed thereon. Generally, the carrier substrate 102 provides temporary mechanical and structural support during subsequent processing steps, such as those described in greater detail below. The carrier substrate 102 may comprise, for example, glass, silicon oxide, aluminum oxide, a combination thereof, and/or the like. The adhesive layer 104 may be any suitable adhesive, such as ultraviolet (UV) glue, which loses its adhesive property when exposed to UV lights, and may be applied via lamination, spin coating, or other suitable techniques. Other types of adhesives may also be used, such as adhesives that lose some adhesive properties when exposed to heat, which may be generated using UV lights or laser.

The protective layer 106 is formed over the adhesive layer 104. As explained in greater detail below, a backside of an integrated circuit die will be placed over the protective layer 106. The protective layer 106 will provide structural support for bonding and help reduce die shift and ball cracking issues. The protective layer 106 also protects the adhesive layer 104 during subsequent processing. It has been found that portions of the adhesive layer 104 may be removed during subsequent processing steps, and that the residue from the adhesive layer 104 may adversely affect subsequent processing steps, including poor chip placement. The protective layer 106 may be formed of, for example, a polybenzoxazole (PBO), polymide, a solder resist, an epoxy with filler base material, such as LC tape, a die attach film (DAF), a polymer-based material, combinations thereof, or the like, to a thickness from about 1 µm to about 40 µm. Protective layers formed of these materials and thicknesses help control warpage, which in turn reduces poor jointing during die assembly.

Figure 2:
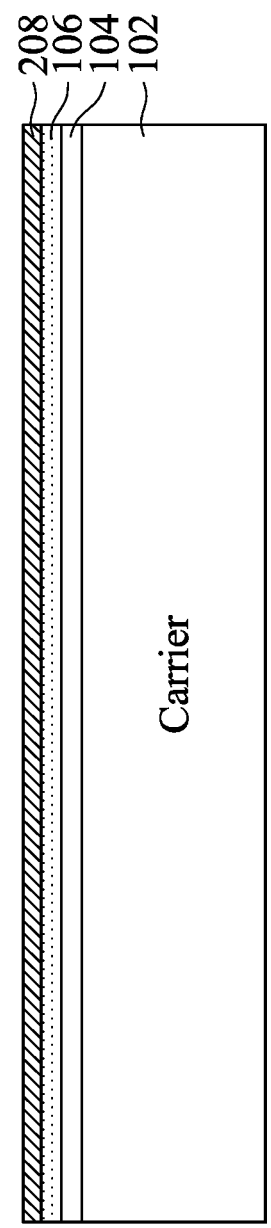

FIG. 2 illustrates a seed layer 208 deposited over the surface of the protective layer 106. The seed layer 208 is a thin layer of a conductive material that aids in the formation of a thicker layer during subsequent processing steps. In an embodiment, the seed layer 208 is formed by depositing a thin conductive layer, such as one or more thin layers of Ti, Cu, Ta, TiN, TaN, combinations thereof, or the like, using CVD or PVD techniques.

Figure 3:
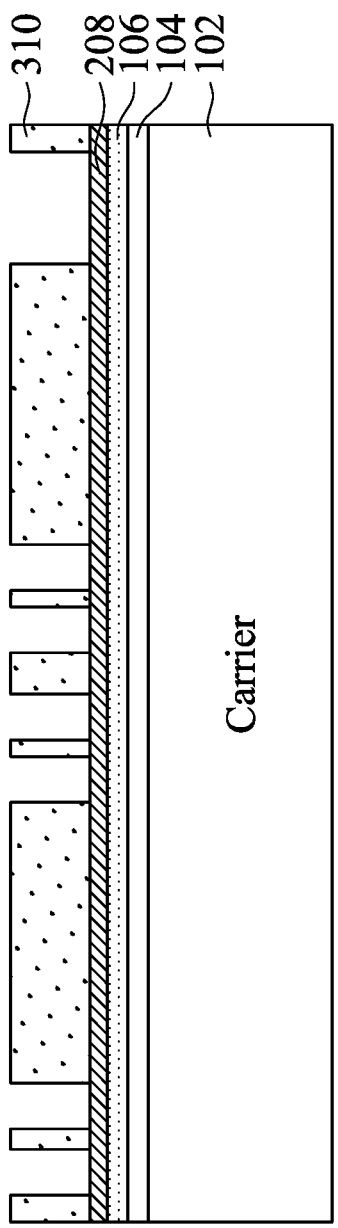

Thereafter, as illustrated in FIG. 3, a patterned mask 310 is formed and patterned over the seed layer 208 in accordance with an embodiment. The patterned mask 310 defines the shape of subsequently formed through vias through a molding compound, thereby providing an electrical connection from a first side of a package to a second side of a package. The patterned mask 310 may be a patterned photoresist mask, hard mask, a combination thereof, or the like.

Figure 4:
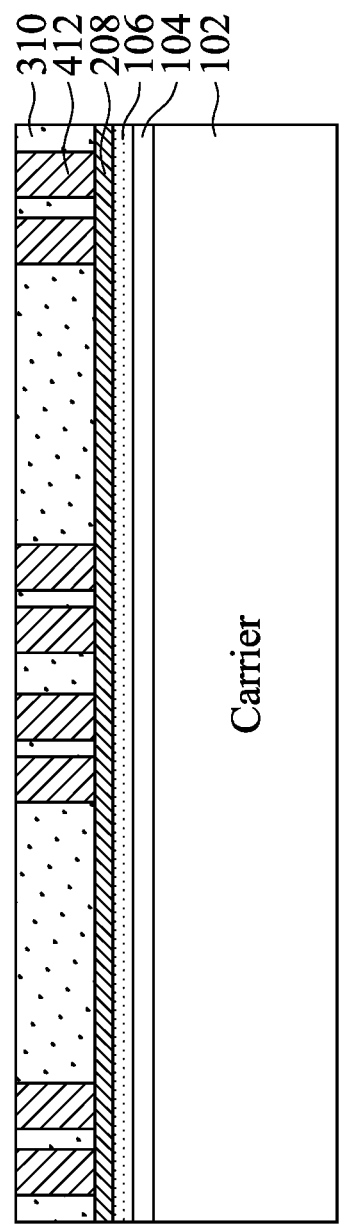

FIG. 4 illustrates the formation of through vias 412 in accordance with an embodiment. The through vias 412 may be formed of any suitable conductive material, including Cu, Ni, Pt, Al, lead-free solder (e.g., SnAg, SnCu, SnAgCu), combinations thereof, or the like, and may be formed through any number of suitable techniques, including electroplating, physical vapor deposition (PVD), chemical vapor deposition (CVD), electrochemical deposition (ECD), molecular beam epitaxy (MBE), atomic layer deposition (ALD), and the like. It should be noted that in some embodiments, such as those that deposit a conformal layer over the entire surface of the wafer (e.g., PVD and CVD), it may be desirable to perform an etching or planarization process (e.g., a chemical mechanical polishing (CMP)) to remove excess conductive material from the surface of the patterned mask 310.

Figure 5:
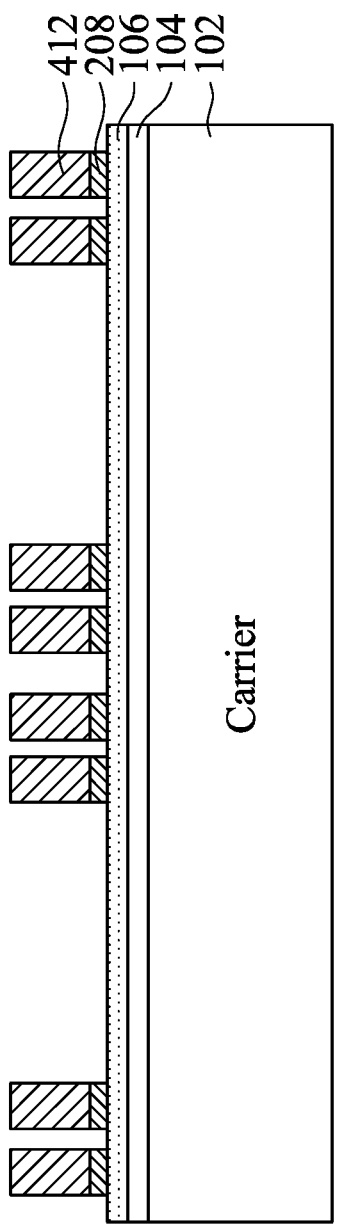

FIG. 5 illustrates removal of the patterned mask 310 in accordance with an embodiment. In embodiments in which the patterned mask 310 is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process. In another embodiment, the photoresist may be stripped using a mixture of a solvent (e.g., dimethyl sulfoxide (DMSO)), an alkaline (e.g., potassium hydroxide KOH or tetramethylammonium hydroxide (TMAH)), and a surfactant additive.

FIG. 5 further illustrates removal of exposed potions of the seed layer 208. The removal process may be performed using, for example, a wet dip in a chemical solution of phosphoric acid ($H_3PO_4$) and hydrogen peroxide ($H_2O_2$), referred to as DPP, with 2% hydrofluoric (HF) acid, or another cleaning process, to remove exposed portions of the seed layer 208 and contaminants from the surface of the protective layer 106.

Figure 6:
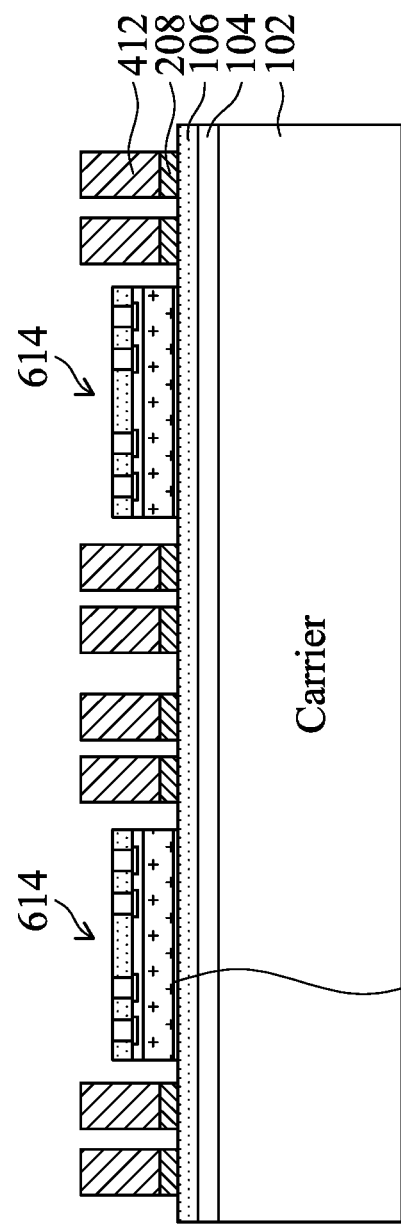

FIG. 6 illustrates placement of one or more first integrated circuit dies 614 in accordance with an embodiment. The first integrated circuit dies 614 are bonded such that a backside of the integrated circuit dies 614, e.g., a side opposite of the electrical contacts, is placed on the protective layer 106 using, for example a die attach film (DAF) 616 or other adhesive. The first integrated circuit dies 614 may be device dies comprising integrated circuit devices, such as transistors, capacitors, inductors, resistors (not shown), and the like, therein. Further, the first integrated circuit dies 614 may be logic dies, central processing unit (CPU) dies, memory dies, or the like. Furthermore, two first integrated circuit dies 614 are shown in FIG. 6 for illustrative purposes, and other embodiments may include fewer or more integrated circuit dies. Additionally, as explained in greater detail below, the structure being formed will be diced to form separate packages, each package containing a single integrated circuit die. In other embodiments, however, each package may contain a plurality of integrated circuit dies.

Referring to FIG. 7, molding compound 716 (alternatively referred to as an encapsulating material) is molded onto integrated circuit dies 614 and through vias 412. The top surface of molding compound 716 may be higher than, or level with, top surfaces of the first integrated circuit dies 614 and/or the through vias 412. In embodiments in which the molding compound 716 is formed to a height greater than the through vias 412, a thinning process may be performed to expose the through vias 412 through the molding compound 716, thereby achieving a result similar to that illustrated in FIG. 7, thereby allowing electrical connections to be made to the through vias such as discussed in greater detail below. The thinning process may employ a mechanical grinding process, a chemical polishing process, an etching process, combinations thereof, or the like.

The through vias 412 may extend above the first integrated circuit dies 614, and accordingly, the through vias 412 and the molding compound 716 may be further reduced such that electrical contact may be made to the first integrated circuit dies 614. The through vias 412 may be reduced by grinding, etching, or another suitable method.

Optionally, a cleaning process may be performed. The above grinding process may result in a grinding residue remaining on the through vias 412. The cleaning process removes or reduces this grinding residue, thereby allowing better electrical contact to be formed to the through vias 412. The cleaning process, which may result in a recess, may be a wet etch process using, for example, KOH, formic acid, $H_2SO_4$, a mixture of HF and $HNO_3$, a mixture of $HClO_4$ and $H_3COOH$, or a solution of phosphoric acid ($H_3PO_4$) and hydrogen peroxide ($H_2O_2$) mixture.

Next, as shown in FIG. 8, one or more redistribution layers (RDLs), one RDL 818 being shown, is formed to provide electrical connections to and/or between the through vias 412 and the first integrated circuit dies 614 in accordance with an embodiment. The RDL 818 may comprise a layer of a dielectric layer (e.g., a passivation layer) having a conductive layer formed therein. The dielectric layer may comprise, for example, a polymer material, such as epoxy, polyimide, polybenzoxazole (PBO), and the like, or may be formed of commonly known dielectric materials, such as spin-on glass, silicon oxide, silicon oxynitride, or the like, formed by any suitable method such as spin coating. The conductive line may be formed of, for example, a metal, such as Cu, Ag, Al, Ni, combinations thereof, or the like.

Also shown in FIG. 8 are a first set of electrical connectors 820 formed along a surface of the RDL 818. Electrical connectors 820 may be solder balls, metal pads, metal pillars, and/or combinations thereof, and may be formed of gold, silver, nickel, tungsten, aluminum, and/or alloys thereof. Optionally, an under-bump metallurgy (UBM) structure may be formed on the RDL 818 prior to forming the first set of electrical connectors 820. Generally, the UBM structure comprises a conductive pad formed upon the RDL and upon which the first set of electrical connectors are placed.

Figure 9:
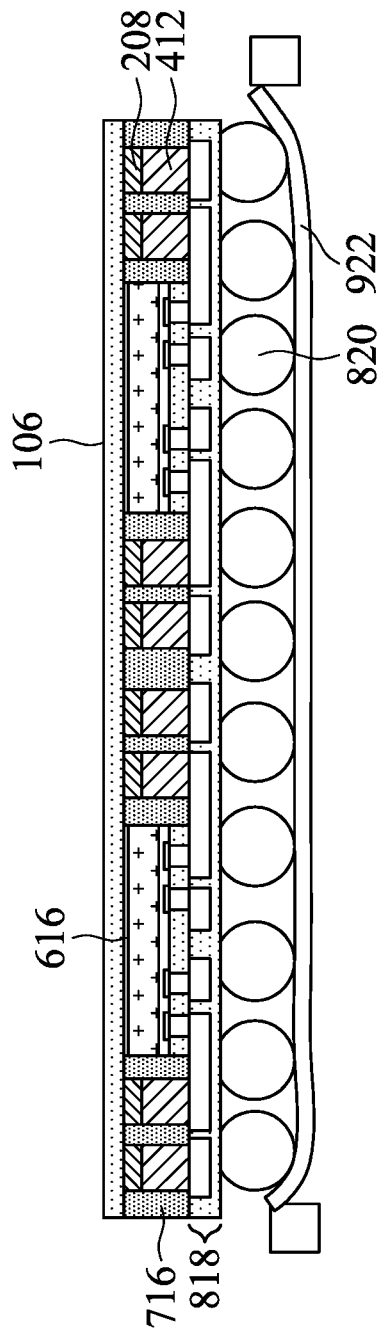

FIG. 9 illustrates the structure of FIG. 8 bonded to a carrier structure, such as a carrier tape 922, after the debonding from the carrier substrate 102 in accordance with an embodiment. In an embodiment, the carrier tape 922 has an adhesive surface that is used to attach the electrical connectors 820 to the carrier tape 922. The carrier substrate 102 is de-bonded. In an embodiment in which the adhesive layer 104 is formed of a light-sensitive adhesive, the carrier substrate 102 may be de-bonded by, for example, exposing the adhesive layer 104 to a UV light or a laser, causing it to lose its adhesive property.

Figure 10:
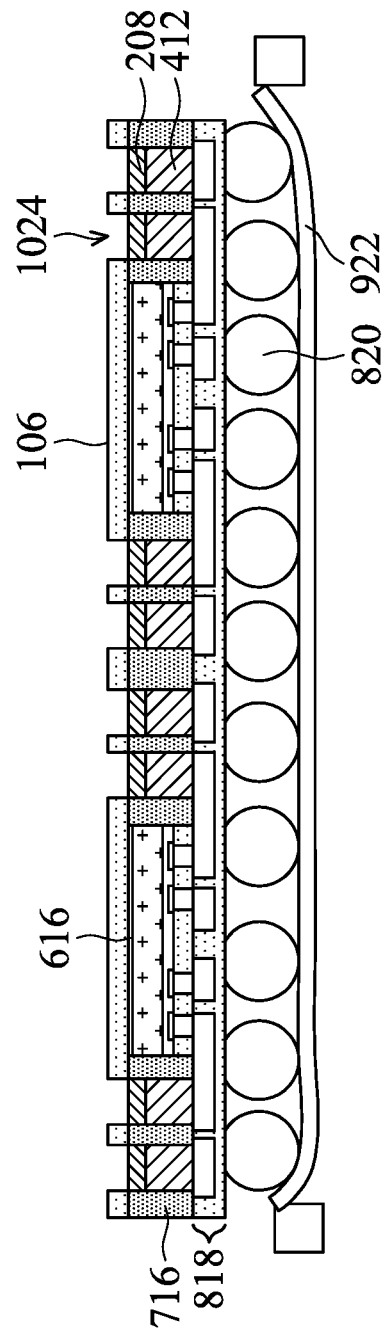

Thereafter, as illustrated in FIG. 10, contact pad openings 1024 may be formed through the protective layer 106 in accordance with an embodiment. The contact pad openings 1024 expose portions of the underlying through vias 412. In subsequent processing, the contact pad openings 1024 allow electrical contact to be made to respective ones of the through vias 412. For example, as discussed below, a semiconductor package having one or more integrated circuit dies 614 may be mounted over the protective layer 106, making electrical contact to the through vias 412 through the contact pad openings 1024. Optionally, a UBM structure may be formed on the exposed portions of the through vias 412 prior to forming the electrical connectors 820.

The contact pad openings 1024 may be formed using etching or laser drilling techniques. For example photolithography techniques may be used to deposit and pattern a mask over the protective layer 106. Thereafter, a dry or wet etch process may be used to form the openings and the mask may be removed.

Optionally, the through vias 412 may be recessed using an etch process to remove the seed layer 208 and/or portions of the through vias 412. It is believed that recessing or removing the seed layer 208 allows a better electrical connection as well as providing more of an indentation into which a solder ball may be placed as explained below. Furthermore, the recesses in the seed layer 208 and/or the through vias 412 may provide more structure support and reduce die shift. The etch process may be wet or dry etch process, such as a gas mixture of $CF_4$, $O_2$, and Ar, a chemical solution of phosphoric acid ($H_3PO_4$) and hydrogen peroxide ($H_2O_2$), referred to as DPP, or 2% hydrofluoric (HF) acid.

Figure 11:
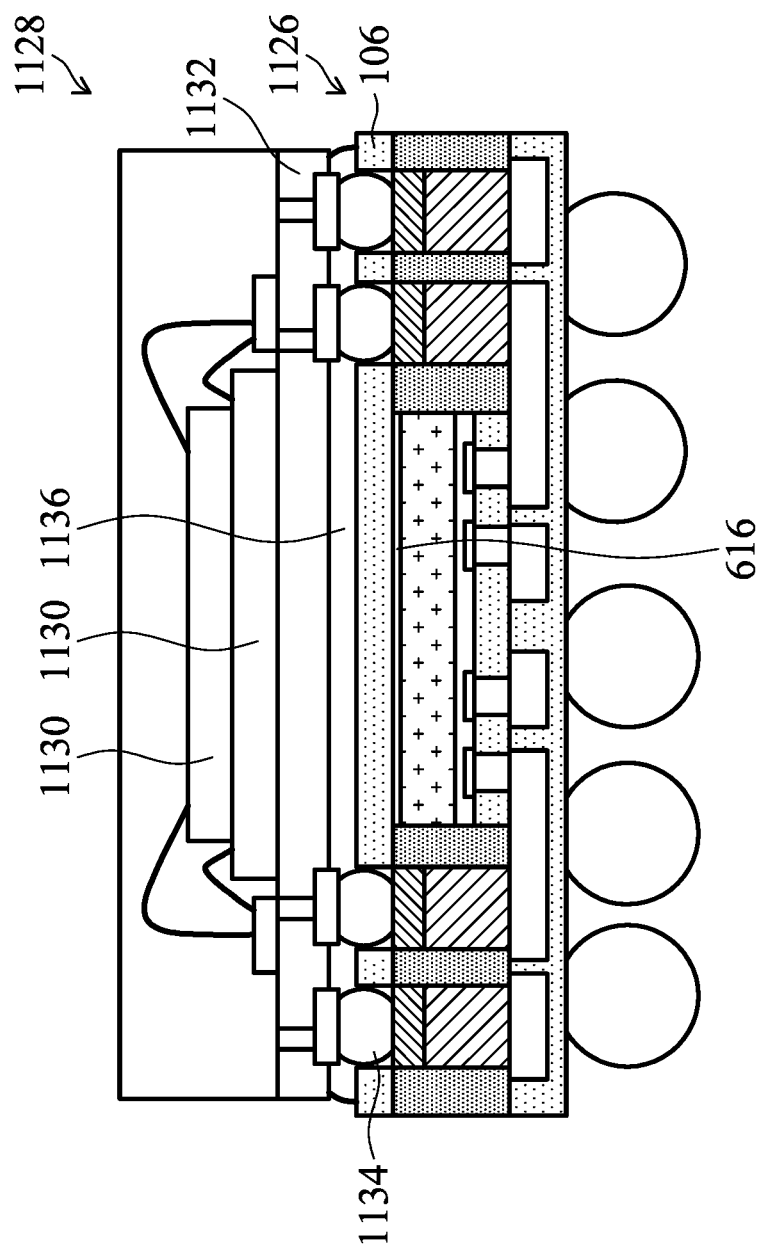

FIG. 11 illustrates results of a dicing process and a stacking of multiple integrated circuit packages in accordance with an embodiment. A first integrated circuit package 1126 is formed from the dicing process performed on the structure illustrated in FIG. 10. A second integrated circuit package 1128 is bonded on the first integrated circuit package 1126. The second integrated circuit package 1128 comprises, for example, two integrated circuit dies 1130 wire bonded onto a packaging substrate 1132. The second integrated circuit package 1128 is electrically coupled to the through vias 412 using, for example, a second set of electrical connectors 1134. The second set of electrical connectors 1134 may be solder balls, metal pads, metal pillars, and/or combinations thereof, and may be formed of gold, silver, nickel, tungsten, aluminum, and/or alloys thereof.

Optionally, a underfill 1136 may be placed between the first integrated circuit package 1126 and the second integrated circuit package 1128. The underfill material 1136 is dispensed between the first integrated circuit package 1126 and the second integrated circuit package 1128. The underfill material 1136 may be a liquid epoxy, deformable gel, silicon rubber, a combination thereof, and/or the like dispensed using acceptable dispensing equipment.

FIGS. 12-18 illustrate another embodiment of forming a PoP structure. The reference numerals utilized in FIGS. 12-18 are the same as similar layers/structures as those used in FIGS. 1-11. As such, layers and structures having the same reference numerals may be formed using similar materials and methods as those discussed above with reference to FIGS. 1-11 and will not be repeated. The following discussion provides a brief overview of the process flow of the second embodiment.

Figure 12:
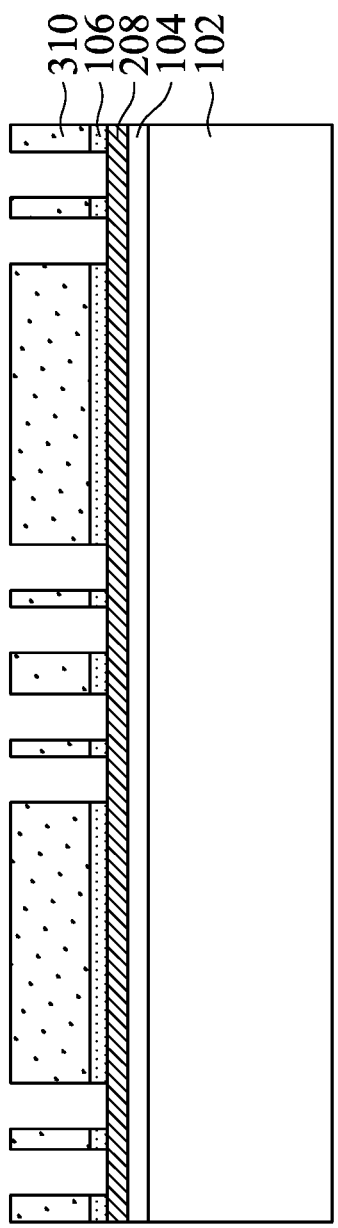
FIGS. 12-18 illustrate various intermediate stages in the manufacturing of a package in accordance with another embodiment.
Figure 13:
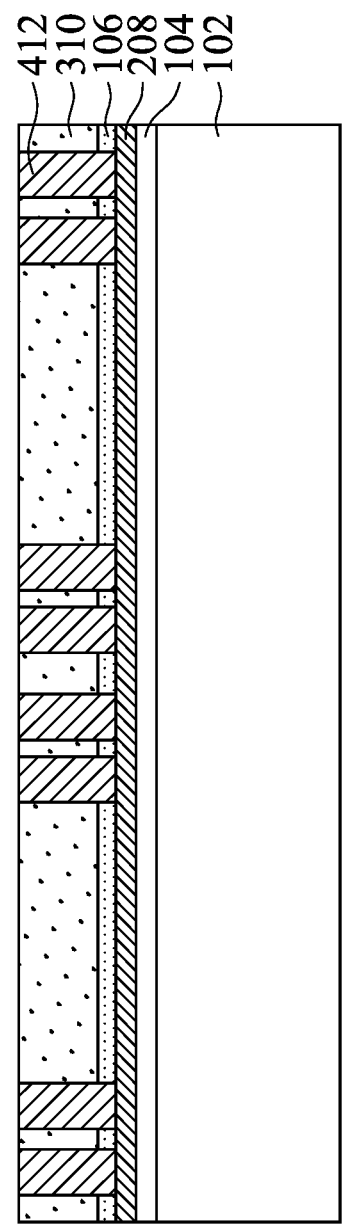

FIG. 12 illustrates a formation of the adhesive layer 104 over the carrier substrate 102. The seed layer 208 is formed over the adhesive layer 104, and the protective layer 106 is formed over the seed layer 208. Also illustrated in FIG. 12 is the patterned mask 310 over the protective layer 106. The patterned mask 310 is patterned to form the through vias 412 as illustrated in FIG. 13. In this embodiment, the protective layer 106 is patterned using the patterned mask 310 prior to forming the through vias 412.

Figure 14:
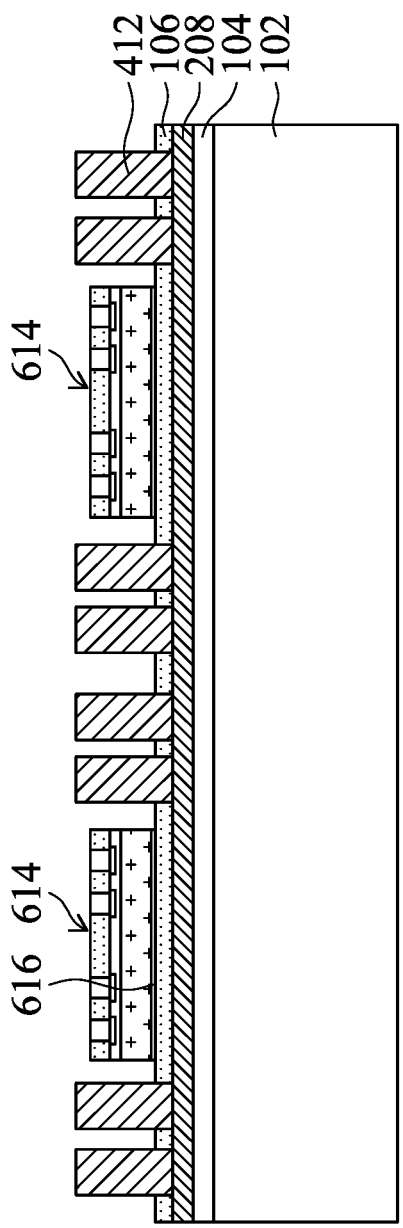
Figure 15:
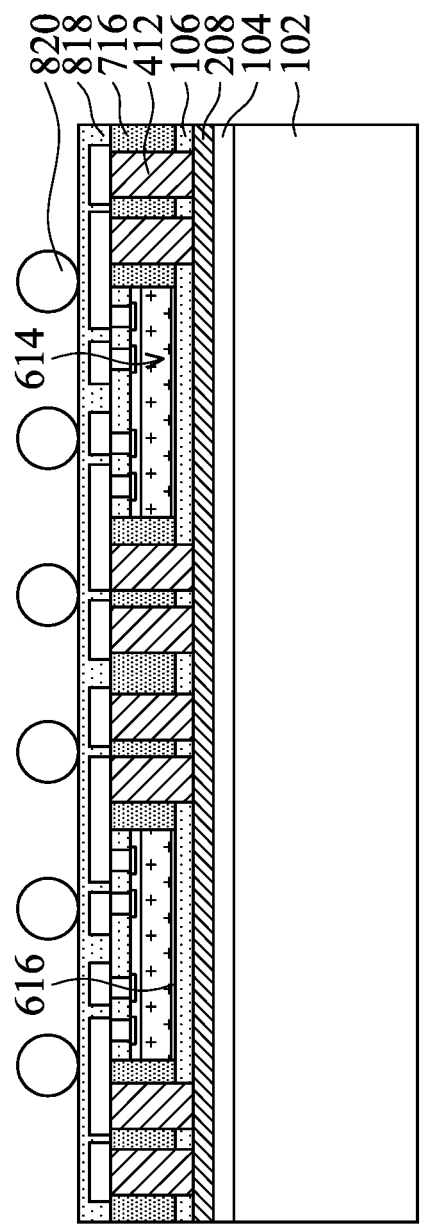

FIG. 14 illustrates removal of the patterned mask 310 and placement of the first integrated circuit dies 614. FIG. 15 illustrates formation and grinding (if necessary) of the molding compound 716, formation of one or more RDLs 818, and placement of the electrical connectors 820.

Figure 16:
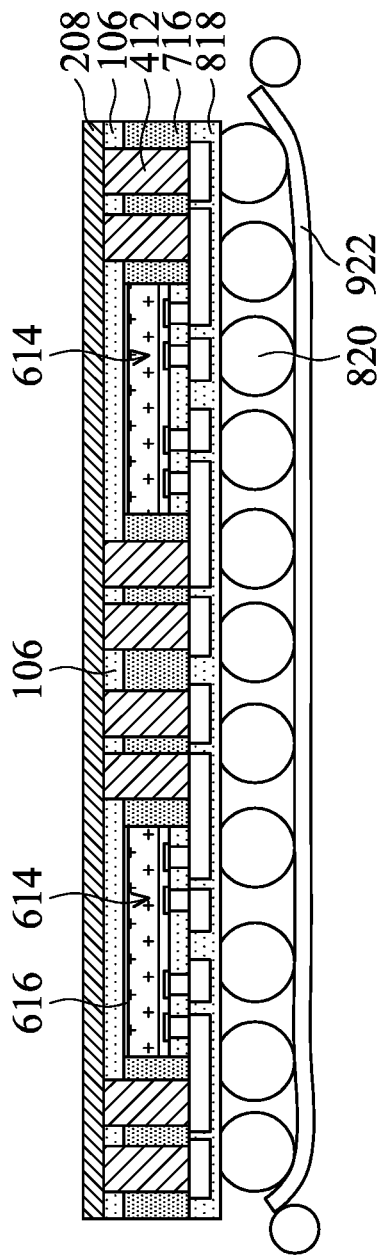
Figure 17:
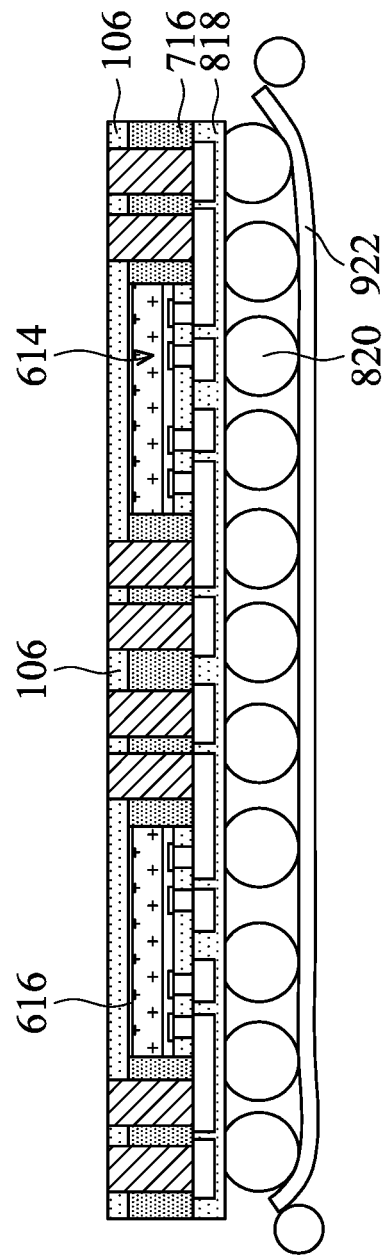
Figure 18:
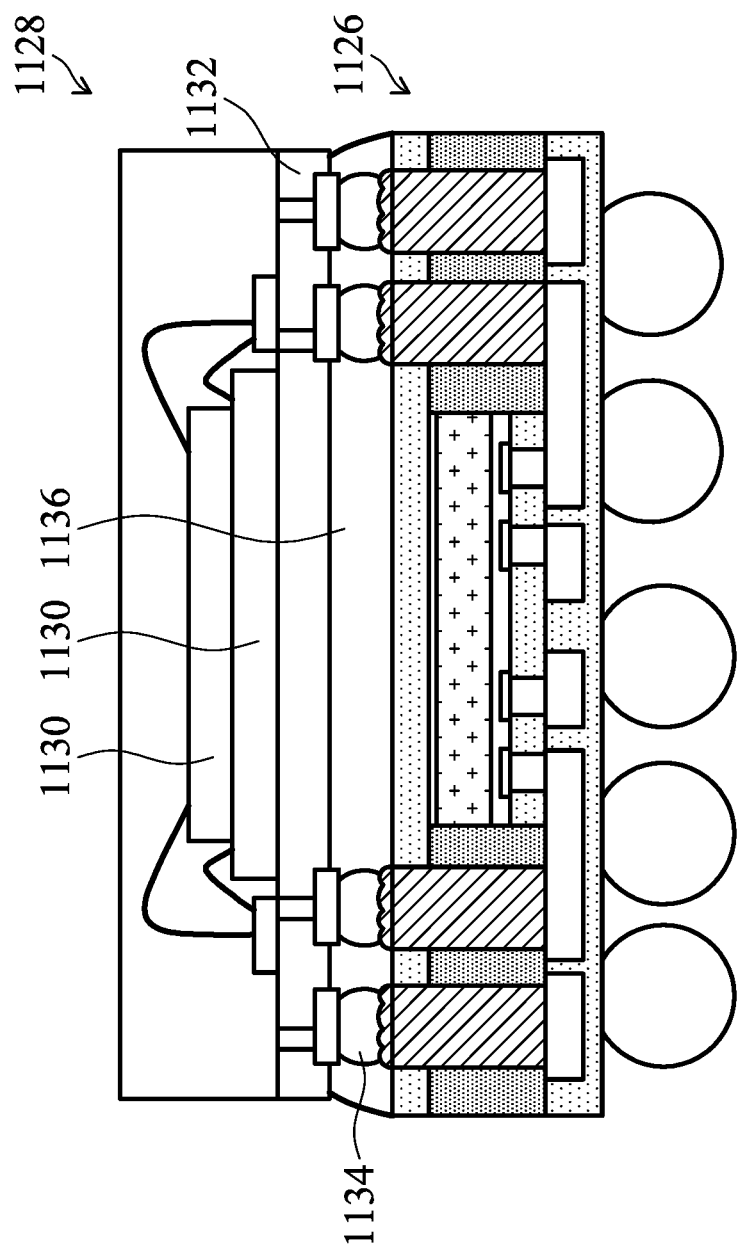

Thereafter, FIG. 16 illustrates attaching the structure to a carrier structure, such as the carrier tape 922, debonding the carrier substrate 102. The seed layer 208 is removed in FIG. 17. The seed layer 208 may be removed, for example, by grinding, etching, combinations thereof, or the like. The final structure is illustrated in FIG. 18 after singulation and attachment of the second integrated circuit package 1128.

The embodiment illustrated in FIGS. 12-18 differ from the embodiment illustrated in FIGS. 1-11 in at least the formation of the seed layer 208 and the protective layer 106. In particular, the embodiment illustrated in FIGS. 1-11 form the protective layer 106 first and the seed layer 208 is formed on top of the protective layer 106. In contrast, the embodiment illustrated in FIGS. 12-18 form the seed layer 208 first and the protective layer 106 is formed over the seed layer 208. As a result of this change in the ordering, the seed layer 208 in the second embodiment is not patterned using the through vias 412 as a mask as illustrated in FIG. 5 of the first embodiment. Instead, the seed layer 208 remains until after the debond process is performed as illustrated in FIG. 16. The resulting package exhibits a protective layer, e.g., a PBO layer, extending over the top of the bottom die and extending partially along a sidewall of the through vias 412.

In comparison, the embodiment illustrated in FIGS. 1-11 have the protective layer 106 over the through vias, with openings formed in the protective layer 106 to form electrical contacts with the through vias 412.

FIGS. 19-22 illustrate yet another embodiment of forming a PoP structure. The reference numerals utilized in FIGS. 19-22 are the same as similar layers/structures as those used in FIGS. 1-11. As such, layers and structures having the same reference numerals may be formed using similar materials and methods as those discussed above with reference to FIGS. 1-11 and will not be repeated. The following discussion provides a brief overview of the process flow of the third embodiment.

Figure 19:
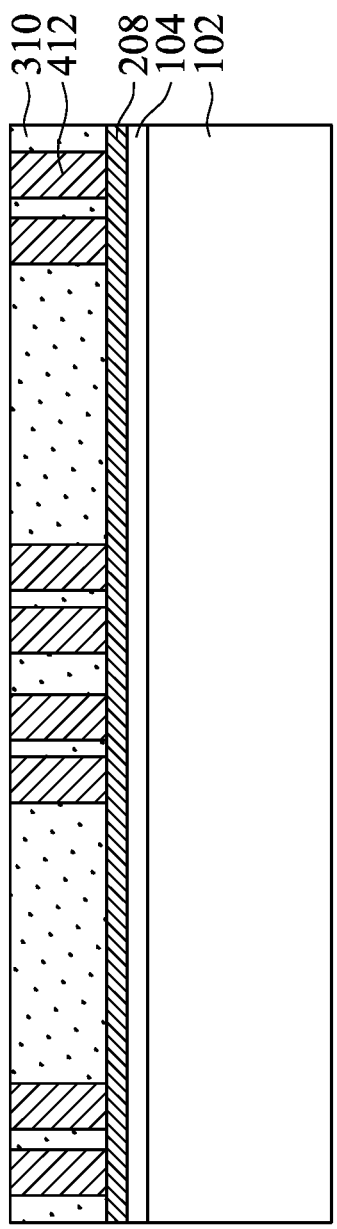
FIGS. 19-22 illustrate various intermediate stages in the manufacturing of a package in accordance with yet another embodiment.

Referring first to FIG. 19, the carrier substrate 102 has formed thereon the adhesive layer 104 and, optionally, the seed layer 208. The patterned mask 310 has been formed and patterned, and the through vias 412 have been formed in openings of the patterned mask 310. In this embodiment, the protective layer 106 is not formed on the carrier substrate 102, rather, the protective layer 106 will be formed directly on the die as discussed below.

Figure 20:
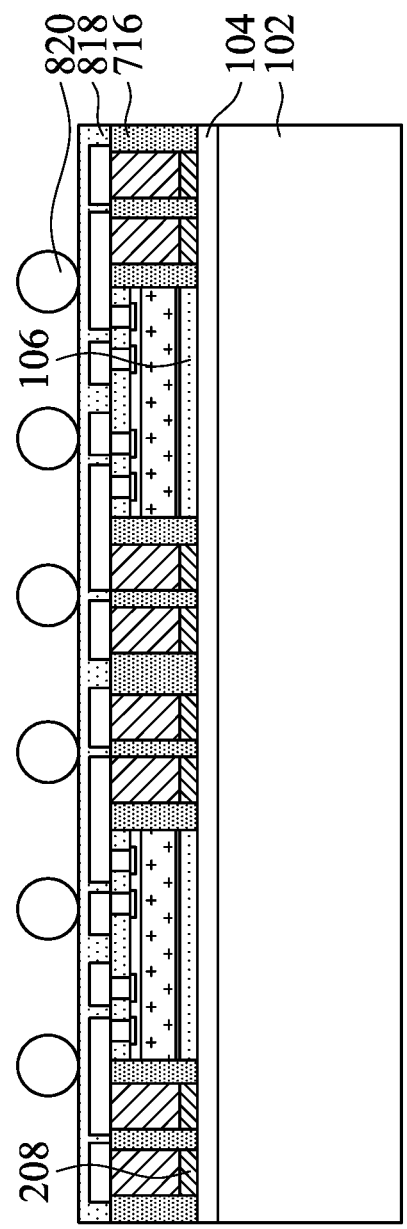
Figure 21:
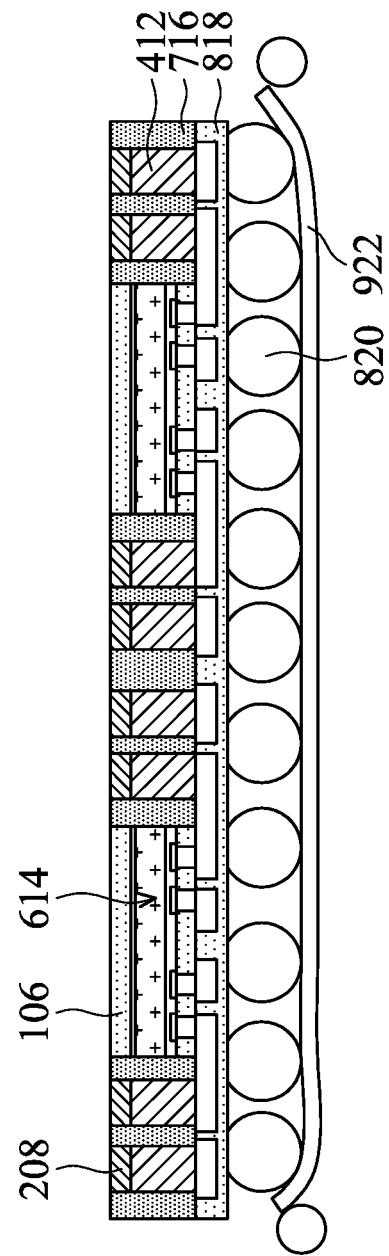
Figure 22:
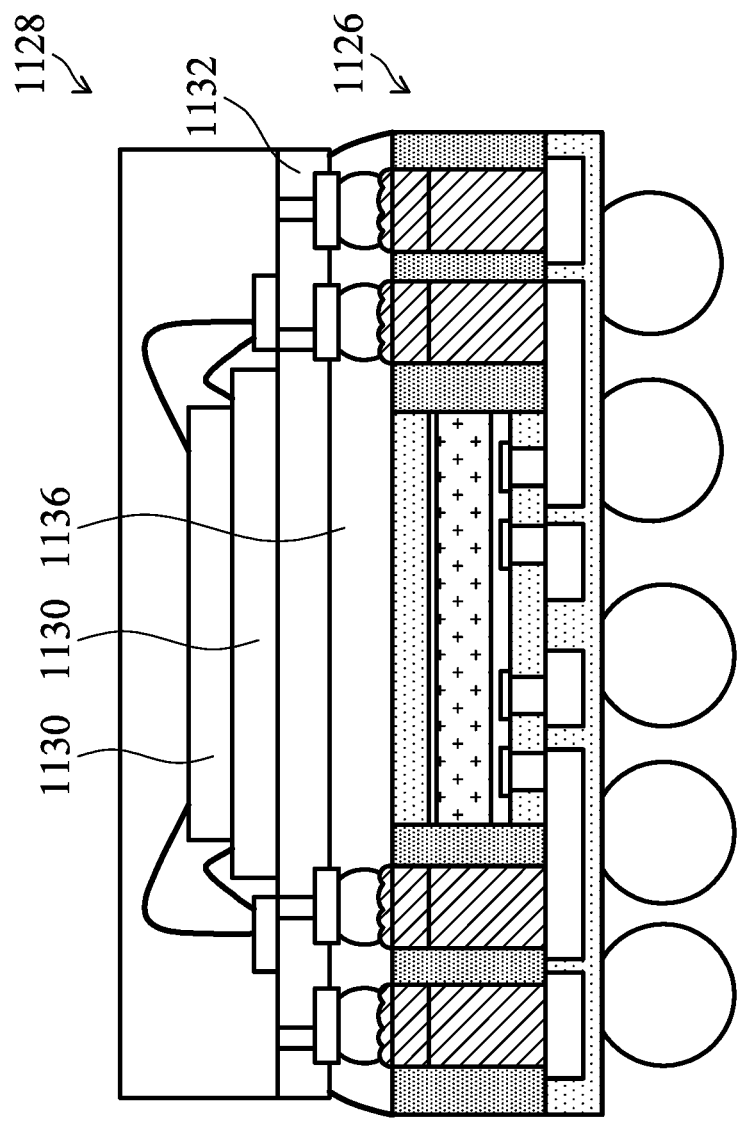

FIG. 20 illustrates removal of the patterned mask 310. Exposed portions of the seed layer 208 may be etched, if present, using the through vias 412 as a mask, similar to the first embodiment. The first integrated circuit dies 614 may be placed. Molding compound 716 is formed (and ground if necessary), RDLs 818 are formed, and electrical connectors 820 are placed. In FIG. 21, the carrier substrate 102 is debonded. The final structure is illustrated in FIG. 22 after singulation and attachment of the second integrated circuit package 1128.

Figure 23:
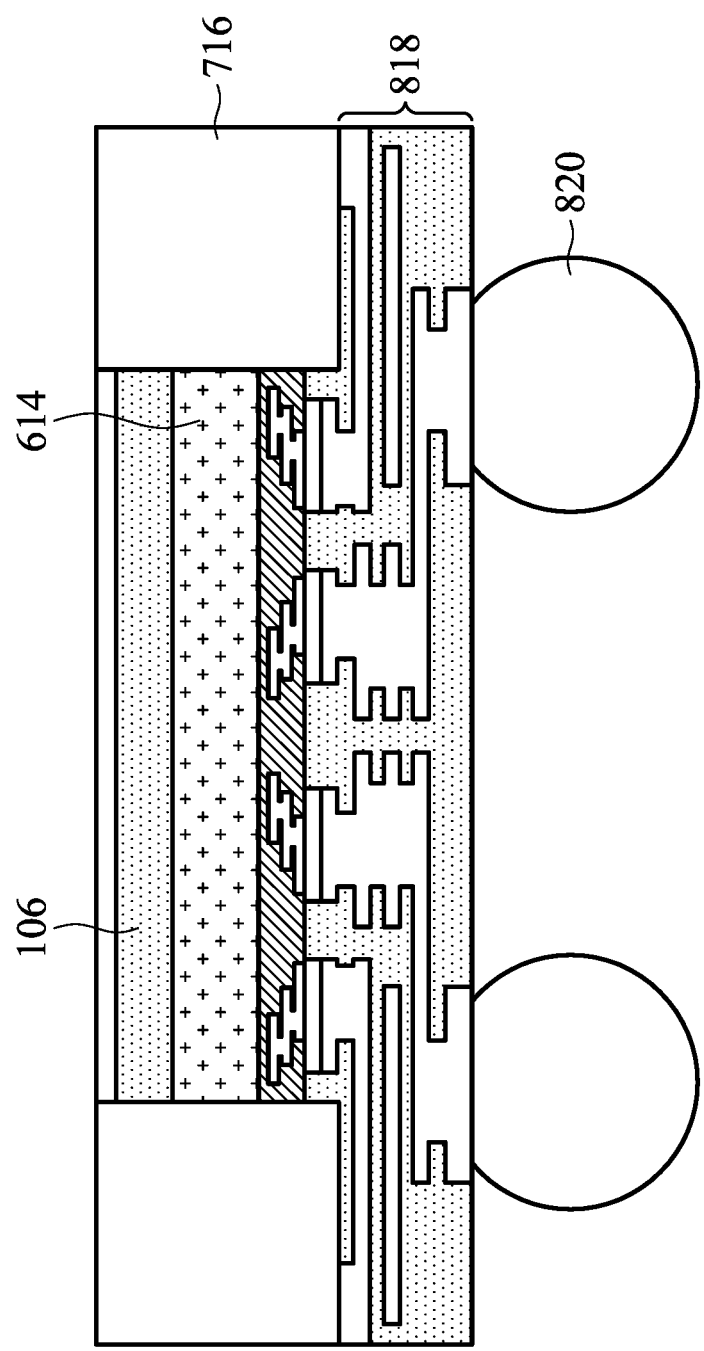
FIG. 23 illustrate a package in accordance with yet still another embodiment.

In yet another embodiment, processes similar to those discussed above may be utilized to form a package without through vias. For example, FIG. 23 illustrates an embodiment in which no through vias are utilized. The processes utilized above with reference to FIGS. 19-22 may be utilized, except steps regarding the optional seed layer and the second integrated circuit package are omitted. Embodiments such as this provide a protective layer, e.g., a PBO layer, over the backside of the integrated circuit die.

Figure 24:
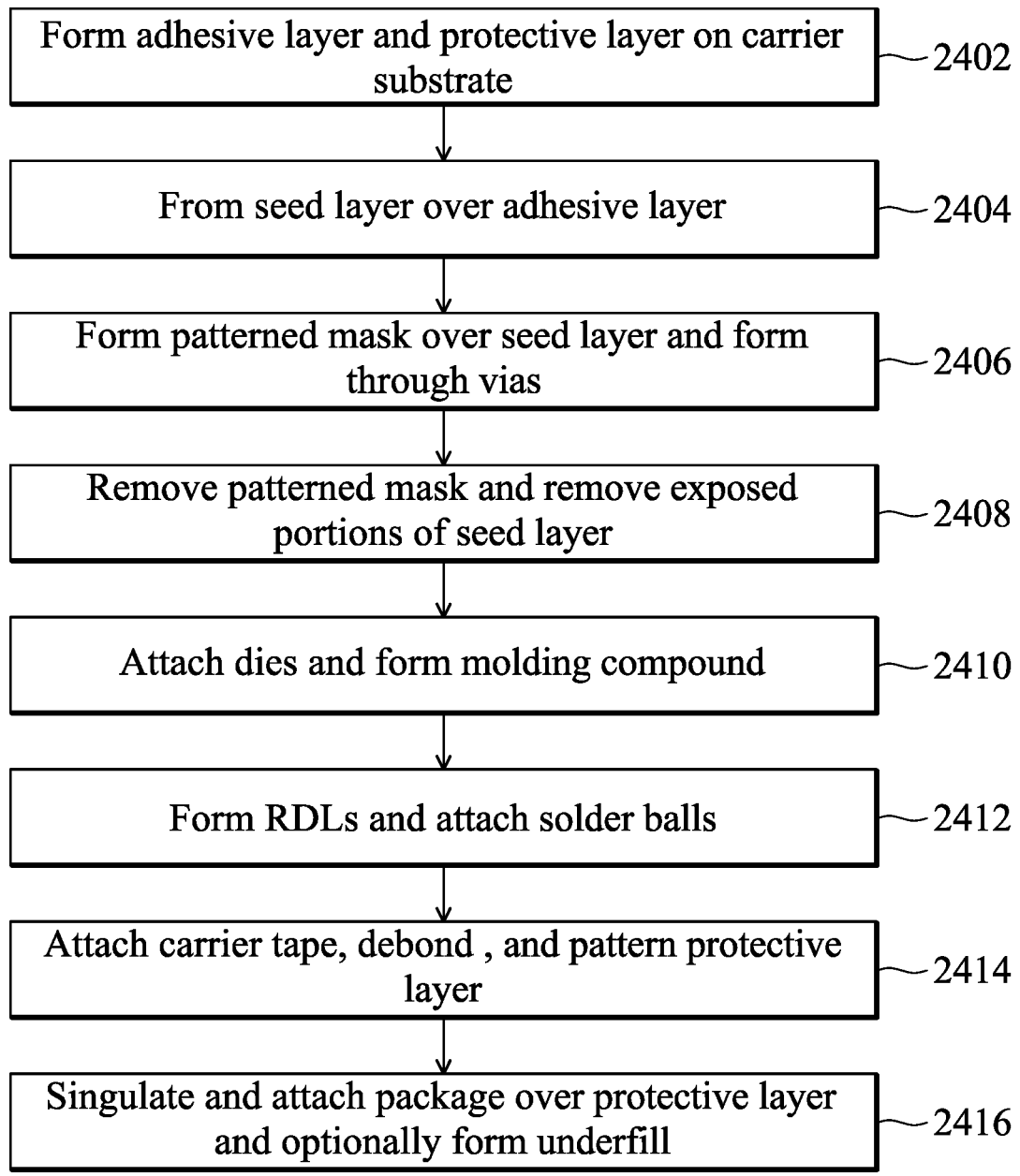
FIG. 24 is a flow chart of a method that may be used in accordance with some embodiments.

FIG. 24 is a flow chart of a process that may be used as described above with reference to FIGS. 1-11. The process begins in step 2402, wherein an adhesive layer and a protective layer are formed on a carrier substrate, as discussed above with reference to FIG. 1. Next, in step 2404, a seed layer is formed over the protective layer, as discussed above with reference to FIG. 2. In step 2406, a patterned mask is deposited and patterned to form openings, which are filled with a conductive material to form through vias, as discussed above with reference to FIGS. 3 and 4. Next, in step 2408, the patterned mask is removed and exposed portions of the seed layer are removed as discussed above with reference to FIG. 5. Dies are attached and a molding compound is formed, as discussed above with reference to FIGS. 6 and 7, in step 2410. In step 2412, RDLs are formed and solder balls are attached as discussed above with reference to FIG. 8. In step 2414, the structure is attached to a carrier tape, the carrier substrate is debonded, and the protective layer is patterned, as discussed above with reference to FIGS. 9 and 10. Finally, in step 2416, a singulation process is performed and a second package is attached to the first package formed above as discussed above with reference to FIG. 11.

Figure 25:
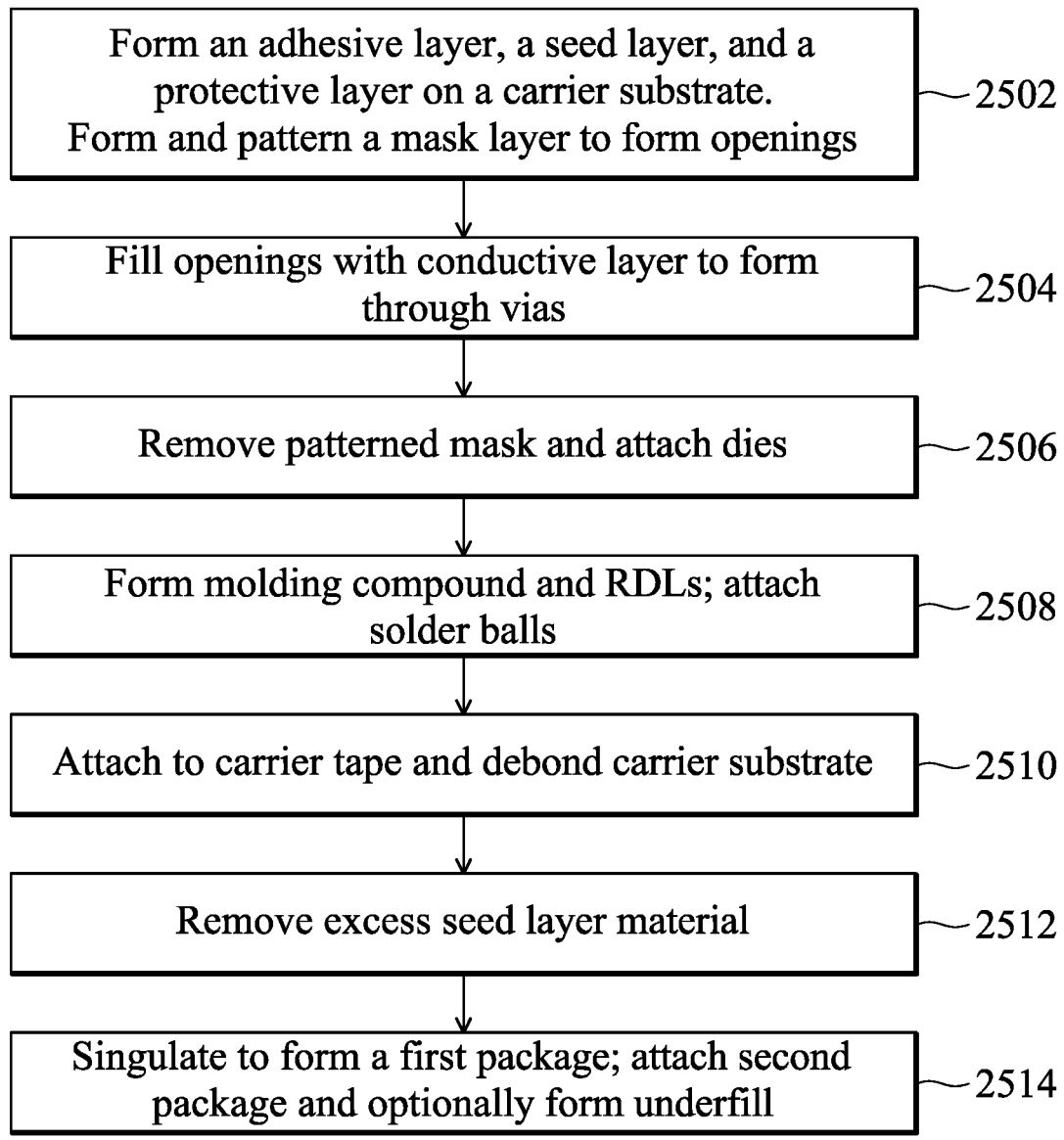
FIG. 25 is a flow chart of a method that may be used in accordance with some other embodiments.

FIG. 25 is a flow chart of a process that may be used as described above with reference to FIGS. 12-18. The process begins in step 2502, wherein an adhesive layer, a seed layer, and a protective layer is formed over a carrier substrate as discussed above with reference to FIG. 12. A patterned mask is also formed and patterned to form openings. Next in step 2504, the openings in the patterned mask are filled with a conductive material to form through vias as discussed above with reference to FIG. 13. In step 2506, the patterned mask is removed and dies are attached, as discussed above with reference to FIG. 14. A molding compound and RDLs are formed and solder balls are attached in step 2508, as discussed above with reference to FIG. 15. Next, in step 2510, the structure is attached to a carrier tape, and the carrier substrate is debonded, as discussed above with reference to FIG. 16. In step 2512, excess material of the seed layer is removed as discussed above with reference to FIG. 17. Finally, in step 2514, a singulation process is performed to form a first package and a second package is formed on the first package as discussed above with reference to FIG. 18. An underfill material may be placed between the first and second packages.

Figure 26:
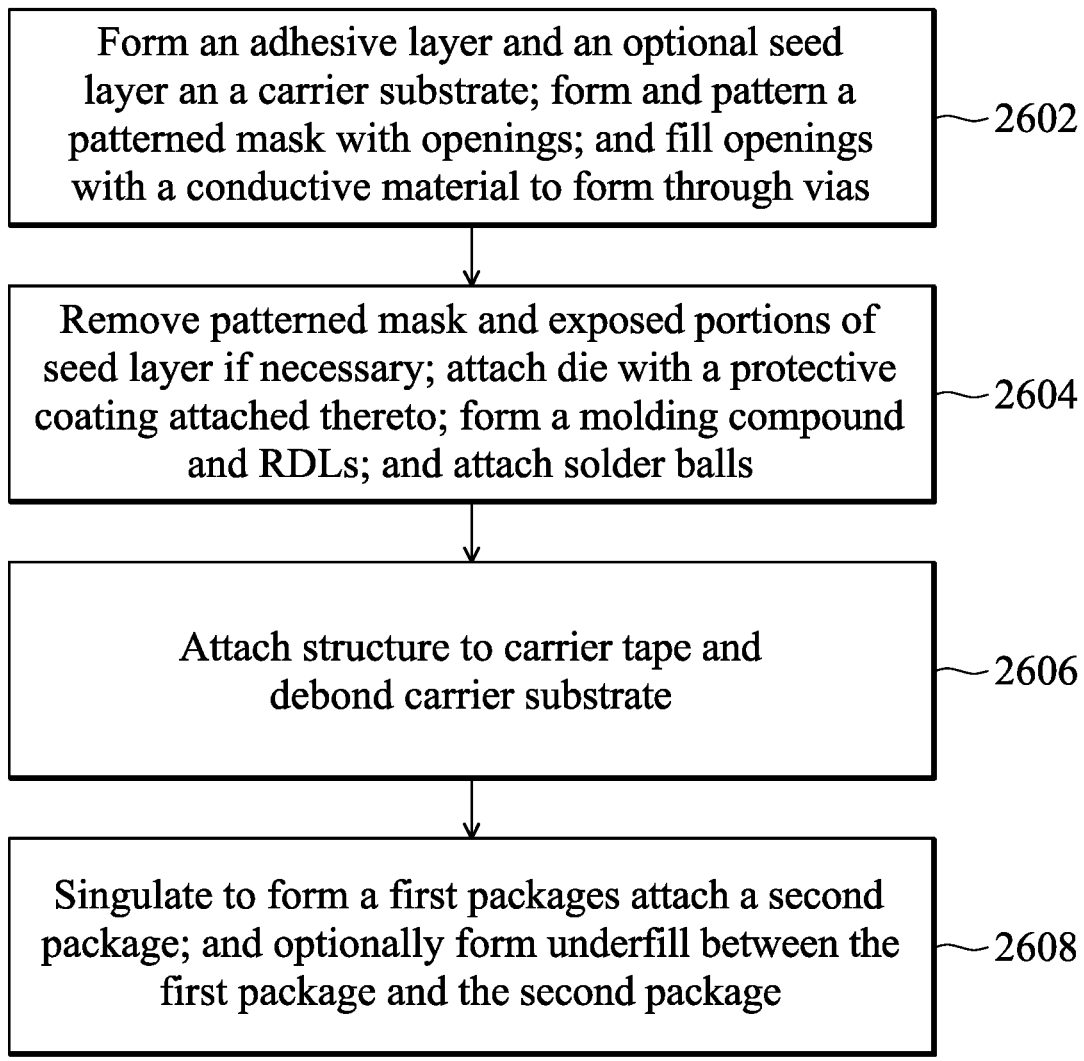
FIG. 26 is a flow chart of a method that may be used in accordance with some other embodiments.

FIG. 26 is a flow chart of a process that may be used as described above with reference to FIGS. 19-23. The process begins in step 2602, wherein an adhesive layer and an optional see layer are formed on a carrier substrate. A mask is formed and patterned with openings, which are filled with a conductive material to form through vias, as discussed above with reference to FIG. 19. Next in step 2604, the patterned mask is removed and exposed portion of the seed layer, if present, are removed. A die with a protective layer attached to the surface of the die is attached to the carrier substrate, and a molding compound and RDLs are formed. Additionally, solder balls are attached, as discussed above with reference to FIG. 20. In step 2606, the structure is attached to a carrier tape, and the carrier substrate is debonded, as discussed above with reference to FIG. 21. Finally, in step 2608, a singulation process is performed to form a first package and a second package is formed on the first package as discussed above with reference to FIG. 22, or optionally a singulation process is performed to form a first package without the through vias as discussed above with reference to FIG. 23. An underfill material may be placed between the first and second packages.

Embodiments such as those discussed above may achieve better warpage control, particularly with thin integrated fan-out (InFO) PoP designs by providing an opposite stress than the warpage induced by the RDL formation. Furthermore, because excess seed layer material is removed prior to forming the molding compound, the amount of metal grinding, which may clog the grinding equipment and cause roughened ground surfaces, is reduced. The protective layer and/or recesses formed in the through vias also may reduce die shift and solder ball cracking by providing additional lateral support.

In an embodiment, a method of forming a semiconductor device is provided. The method includes forming a protective layer over a carrier substrate and forming through vias extending up from the protective layer. One or more dies are attached to the protective layer, and a molding compound is placed between the through vias ant the dies. Electrical connectors are placed on the through vias and electrical contacts on the dies. A debonding process removes the carrier wafer and the protective layer is exposed.

In another embodiment, a semiconductor device is provided. The semiconductor device includes a first package and a second package mounted on the first package. The first package includes one or more RDLs and an integrated circuit die on the RDLs. A molding compound is placed adjacent the sidewalls of the integrated circuit dies and through vias extend through the molding compound. A protective layer is over the integrated circuit dies.

In yet another embodiment, a method of forming a semiconductor device is provided. The method includes forming a seed layer over a carrier substrate and a protective layer over the seed layer, the protective layer having openings. Through vias are formed extending from the seed layer, the through vias extending through the openings of the protective layer. A die is attached to the protective layer, and a molding compound is formed between the through vias and the die. Electrical connectors are electrically coupled to the through vias and electrical contacts on the die. The carrier substrate is debonded, exposing the seed layer, and after the debonding, the seed layer is removed to expose the through vias.

In yet still another embodiment, a method of forming a semiconductor device is provided. The method includes forming a protective layer over a carrier substrate, the protective layer having an opening, and forming a through via in the opening of the protective layer. A die is attached to the protective layer, and a molding compound is formed between the through via and the die. Electrical connectors are electrically coupled to the through via and electrical contacts on the die, and after the electrically coupling, debonding the carrier substrate.

In yet still another embodiment, a semiconductor device is provided. The semiconductor device includes a first package, which further includes an integrated circuit die with a molding compound adjacent sidewalls of the integrated circuit die. A protective layer extends over the integrated circuit die and the molding compound, and through vias extends through the molding compound and the protective layer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor device, the method comprising:
    forming a protective layer over a backside of an integrated circuit die, wherein a die-attach film is interposed between the protective layer and the integrated circuit die, the integrated circuit die having an active side opposite the backside, the active side having electrical contacts;
    forming an adhesive layer over a substrate;
    forming conductors over the adhesive layer;
    after forming the protective layer over the backside of the integrated circuit, attaching the protective layer to the adhesive layer, wherein the protective layer is interposed between the integrated circuit die and the adhesive layer; and
    forming a molding compound over the adhesive layer along opposing sidewalls of the integrated circuit die, opposing sidewalls of the conductors, and opposing sidewalls of the protective layer.

2. The method of claim 1 further comprising removing the adhesive layer and the substrate from the protective layer and the molding compound.

3. The method of claim 1, wherein a surface of the conductors are level with a surface of the protective layer.

4. The method of claim 1, wherein forming the conductors comprises:
    forming a seed layer over the adhesive layer;
    forming a mask over the seed layer, the mask having openings corresponding to each of the conductors;
    forming a through via over the seed layer in the openings; and
    removing the mask and exposed portions of the seed layer.

5. The method of claim 1 further comprising:
    attaching a package to the conductors using solder connectors; and
    forming an underfill between the package and the protective layer and between the package and the molding compound, wherein the underfill directly contacts the protective layer.

6. The method of claim 1 further comprising:
    forming one or more redistribution layers over the molding compound and the integrated circuit die.

7. The method of claim 1, wherein sidewalls of the protective layer are aligned with sidewalls of the integrated circuit die.

8. A method of forming a semiconductor device, the method comprising:
    attaching an integrated circuit die and a protective layer to a carrier substrate, wherein the protective layer is interposed between the integrated circuit die and the carrier substrate, wherein the integrated circuit die is attached to the protective layer using a die-attach film, the integrated circuit die having an active side and a backside, the active side having electrical contacts;
    forming conductors on the carrier substrate adjacent the integrated circuit;
    forming a molding compound adjacent sidewalls of the integrated circuit die and the conductors;
    attaching a package to the conductors by electrical connectors; and
    forming an underfill between the protective layer and the package, wherein the underfill directly contacts the protective layer.

9. The method of claim 8, wherein the conductors extend through the protective layer.

10. The method of claim 8, wherein forming the conductors comprises:
    forming a seed layer on the carrier substrate; and
    forming a conductor layer over the seed layer, wherein a surface of the seed layer is level with a surface of the protective layer.

11. The method of claim 8, wherein attaching the integrated circuit die and the protective layer to the carrier substrate comprises:
    attaching the protective layer to the integrated circuit die using the die-attach film; and
    after attaching the protective layer, attaching the protective layer to the carrier substrate.

12. The method of claim 11, wherein sidewalls of the protective layer are aligned with sidewalls of the integrated circuit die.

13. The method of claim 8, wherein the electrical connectors comprise solder.

14. The method of claim 13, wherein the solder extends through the protective layer.

15. A method of forming a semiconductor device, the method comprising:
    forming a protective layer on a backside of a die using a first adhesive, the protective layer having lateral edges aligned with lateral edges of the die;
    forming a second adhesive over a carrier substrate;
    forming conductors over the second adhesive;
    attaching the protective layer to the carrier substrate;
    forming a molding compound along sidewalls of the die and the conductors; and
    forming one or more redistribution layers over an active side of the die, the one or more redistribution layers extending over the molding compound.

16. The method of claim 15, wherein sidewalls of the protective layer are covered by the molding compound.

17. The method of claim 16, wherein the molding compound extends along entire sidewalls of the conductors.

18. The method of claim 16, wherein a surface of the conductors is level with a surface of the protective layer.

19. The method of claim 16, wherein the conductors comprise a seed layer.

20. The method of claim 16 further comprising:

attaching a package to the conductors, wherein the protective layer is interposed between the package and the die.

\* \* \* \* \*